United States Patent
Sane et al.

(10) Patent No.: US 6,867,715 B2
(45) Date of Patent: Mar. 15, 2005

(54) SYSTEM, METHOD, AND APPARATUS FOR VARIABLE LENGTH DECODER

(75) Inventors: Aniruddha Sane, Bangalore (IN); Ramanujan Valmiki, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/606,145

(22) Filed: Jun. 25, 2003

(65) Prior Publication Data

US 2004/0263364 A1 Dec. 30, 2004

(51) Int. Cl.[7] .............................................. H03M 7/40
(52) U.S. Cl. .............................. 341/67; 341/50; 341/51
(58) Field of Search .............................. 341/67, 50, 51, 341/60; 375/240.1, 240.23

(56) References Cited

U.S. PATENT DOCUMENTS

| | | | | |
|---|---|---|---|---|
| 5,394,144 A | * | 2/1995 | Kim | 341/67 |
| 5,821,887 A | * | 10/1998 | Zhu | 341/67 |
| 5,870,039 A | * | 2/1999 | Imanishi et al. | 341/67 |
| 2003/0043156 A1 | * | 3/2003 | Macy et al. | 345/537 |
| 2003/0169815 A1 | * | 9/2003 | Aggarwal et al. | 375/240.12 |

* cited by examiner

*Primary Examiner*—Brian Young
*Assistant Examiner*—John B Nguyen
(74) *Attorney, Agent, or Firm*—McAndrews, Held & Malloy, Ltd.

(57) ABSTRACT

A system method, and apparatus for decoding a bitstream comprising variable length coded symbols are presented herein. The bitstream is parsed and the symbols that are decoded are extracted from the bitstream. The symbols that are not decoded in the parse are stored in a register. When the register is full, the contents therein are stored in the next available data word in the memory. In the foregoing manner, the bitstream without the decoded symbols is stored continuously in memory, even where the width of the memory is substantially wider than the variable length symbols.

12 Claims, 4 Drawing Sheets

US 6,867,715 B2

SYSTEM, METHOD, AND APPARATUS FOR VARIABLE LENGTH DECODER

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The Digital video coding standard (DV), is a video coding standard that uses variable length codes (Huffman Codes) and a complex scheme of arranging the variable length coded data to achieve fixed data rate. Variable length codes are characterized by representing data with symbols of varying length.

In Digital Video Coding (DV) the order of the variable length coded symbols is not same as the order in which they need to be decoded. So during decode, the symbols are usually decoded by parsing the symbol stream multiple times. During the first parsing of the symbol stream, a first group of symbols are decoded. Decoding the first group of symbols yields the information required to separate a second group of symbols from the first group. Decoding in multiple parses presents a unique challenge for decoding the symbol stream in real-time.

After decoding the symbols stream during the first parse, the decoder stores the stream for parsing the second time. The streams are stored in memory in a number of different ways. In one way, after the first parse, the variable length symbols that are decoded are replaced with the decoded symbols. The foregoing results in a bit stream that includes both encoded and decoded symbols. During the second parse, the decoder ignores the decoded symbols and decodes the encoded symbols. The foregoing is disadvantageous because the decoded symbols consume processing cycles to scan. Another way for storing the streams involves parsing the stream and, during the parsing, storing each symbol that is not decoded. The foregoing results in the storage of the bitstream without the decoded symbols. However, memory is usually accessible in units of data words. Many of the variable length symbols may be substantially smaller than the width of the data word. As a result, storing symbols in the foregoing manner results in truncation of the remaining fractional portion of the data words after storage of the symbol. In other words, many of the bits in the data words do not store data from the bitstream. Truncation of the remaining fractional portion unnecessarily increases memory consumption.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Presented herein is a system, method, and apparatus for decoding variable length codes. In one embodiment, variable length codes are decoded by receiving a stream comprising a first plurality of variable length codes and a second plurality of variable length codes; decoding the first plurality of variable length codes; storing one or more symbols from the second plurality of variable length codes in a first register; storing a portion of a particular symbol from the second plurality of variable length codes in the first register; storing another portion of the particular symbol in a second register; and storing the contents of the first register in memory after storing the portion of the particular symbol from the second plurality of variable length codes in the first register.

In another embodiment, there is presented a system for decoding variable length codes comprising a presentation buffer, a processor, a first register, a second register, and a memory. The presentation buffer receives a stream comprising a first plurality of variable length codes and a second plurality of variable length codes. The processor decodes the first plurality of variable length codes. The first register stores one or more symbols from the second plurality of variable length codes and a portion of a particular symbol from the second plurality of variable length codes. The second register stores another portion of the particular symbol. The memory stores the contents of the first register after the first register stores the portion of the particular symbol from the second plurality of variable length codes.

In another embodiment, there is presented a circuit for decoding variable length codes comprising a processor and memory. The processor is connected to the memory. The memory stores a plurality of instructions. The instructions comprise decoding the first plurality of variable length codes; writing one or more symbols from the second plurality of variable length codes in a first register; writing a portion of a particular symbol from the second plurality of variable length codes in the first register; writing another portion of the particular symbol in a second register; and writing the contents of the first register in memory after storing the portion of the particular symbol from the second plurality of variable length codes in the first register.

These and other advantages and novel features of the present invention, as well as details of an illustrated embodiment thereof, will be more fully understood from the following description and drawings.

DETAILED DESCRIPTION OF THE INVENTION

Although the following embodiments of the present invention are described with a particular emphasis on Digital Video Coding (DV) standard, it is noted that the following can be incorporated with a variety of coding schemes.

Figure 1:
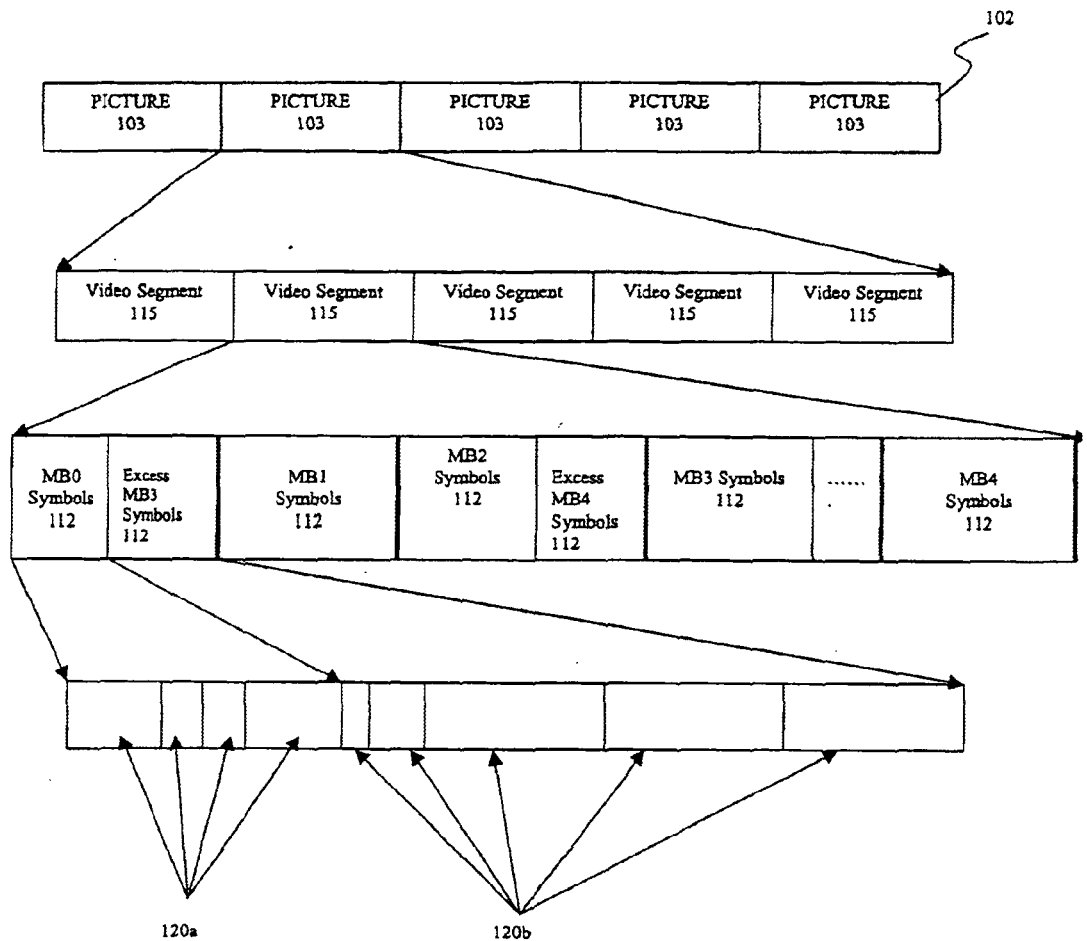
FIG. 1 is a block diagram describing DV macroblock encoding in accordance with an embodiment of the present invention.

Referring now to FIG. 1, there is illustrated a block diagram describing video data encoded in accordance with the Digital Video Coding (DV) scheme. A video sequence 102 includes an encoded representation of a series of pictures 103. Each picture 103 is a series of video segments 115. Each video segment comprises five macroblocks. In DV, the five macroblocks 112 forming a video segment 115 are not necessarily spatially contiguous. Video segments 115 may include macroblocks 112 that are throughout the entire picture 103. The foregoing is known as Macroblock shuffling.

Macroblocks 112 within a video segment 115 include sequences of variable length coded symbols 120. Variable length coding generally uses fewer bits to encode more common symbols, and more bits to encode less common symbols. Excess symbols (Symbols that do not fit within the designated space for that macroblock), from one macroblock can be placed in the vacant/unused areas (these are created because a macroblock may not fill the entire space allocated to it), in the other macroblocks within the same segment.

The pictures 103 together form the video sequence 102. The video sequence 102 is then packetized and prepared for transport. A transport stream is used to transport the video sequence 102.

Figure 2:
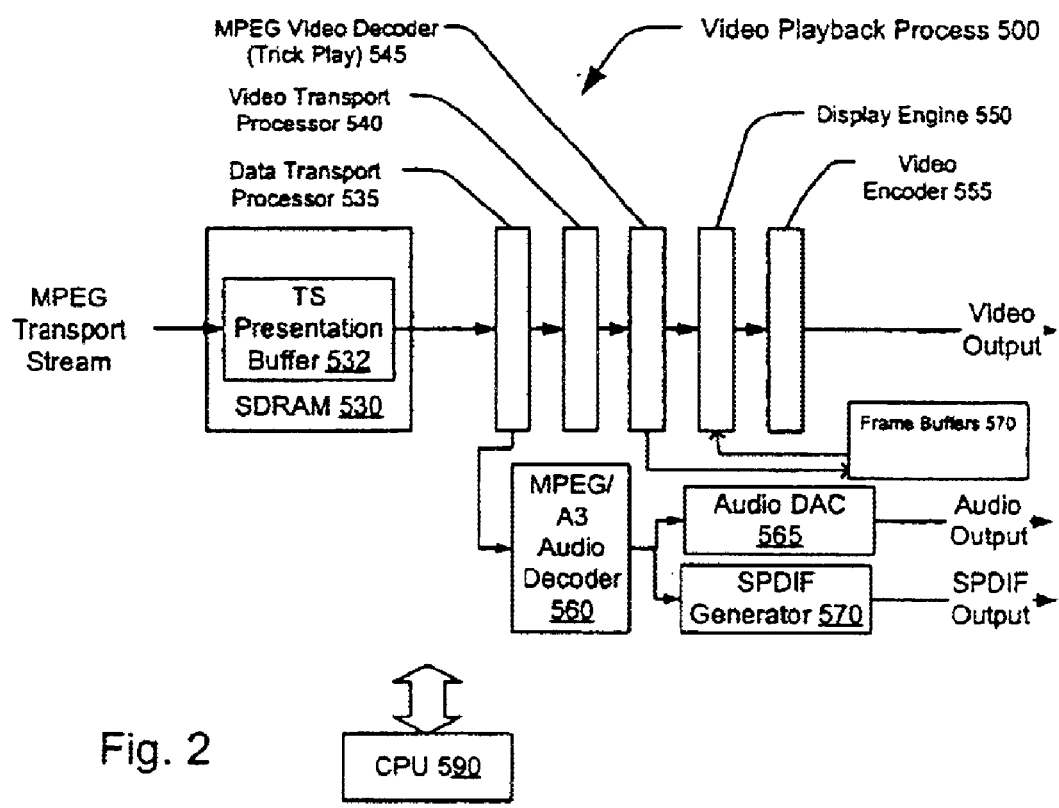
FIG. 2 is a block diagram of an exemplary decoder in accordance with an embodiment of the present invention.

Referring now to FIG. 2, there is illustrated a block diagram of an exemplary decoder in accordance with an embodiment of the present invention. Data is output from buffer 532 within SDRAM 530. The data output from the presentation buffer 532 is then passed to a data transport processor 535. The data transport processor 535 demultiplexes the transport stream into packetized elementary stream constituents, and passes the audio transport stream to an audio decoder 560 and the video transport stream to a video transport decoder 540 and then to a DV video decoder 545. The audio data is then sent to the output blocks, and the video is sent to a display engine 550. The display engine 550 scales the video picture, renders the graphics, and constructs the complete display. Once the display is ready to be presented, it is passed to a video encoder 555 where it is converted to analog video using an internal digital to analog converter (DAC). The digital audio is converted to analog in an audio digital to analog converter (DAC) 565.

The video decoder 545 decodes the video segments 115, and the macroblocks 112 therein. The macroblocks 112 within a video segment 115 include sequences of variable length coded symbols 120.

Figure 3:
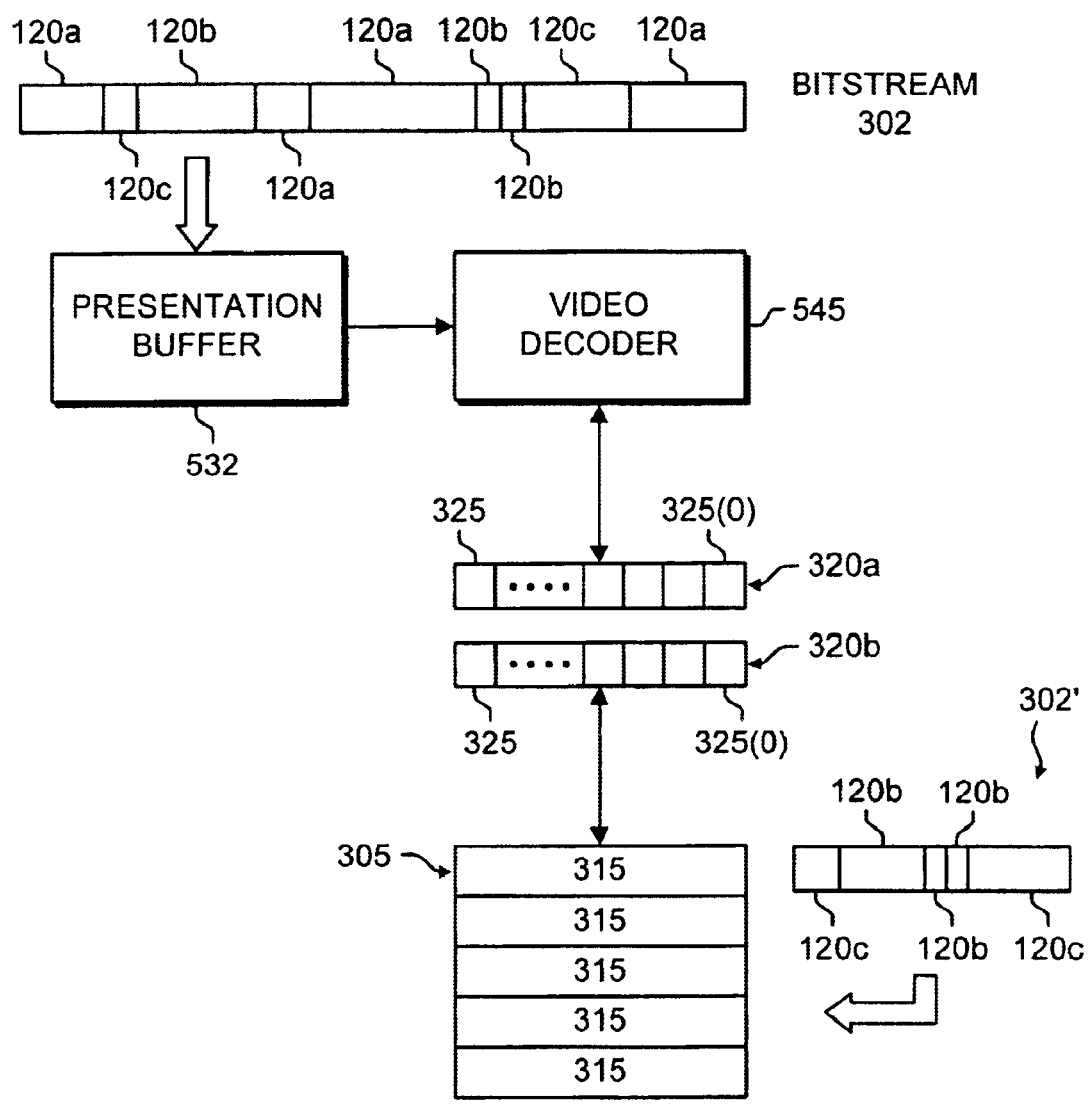
FIG. 3 is a block diagram describing a circuit in accordance with an embodiment of the present invention.

Referring now to FIG. 3, there is illustrated a block diagram describing the decoding process of a macroblock 112 comprising a bit stream 302. The bitstream 302 is usually received by the presentation buffer 532. The macroblocks 112 within a slice group 115 include sequences of variable length coded symbols 120. During decoding, the symbols are usually decoded by parsing the bit stream 302 multiple times. During the first parsing of the symbol stream, a first group of symbols 120a are decoded. Decoding the first group of symbols 120a yields the information required to separate the group of symbols 120b.

After decoding a group of symbols, such as the first group of symbols 120a, during the parsing of the bitstream 302, the video decoder 545 extracts the decoded group of symbols, e.g., the first group of symbols 120a, and stores the remainder of the bitstream 302' in a memory 305. The memory 305 comprises any number of data words 315. The data words 315 are the fundamental storage units within the memory 305. The memory 305 is accessible on a data word 315 by data word basis.

As the video decoder 545 parses the bitstream 302, the video decoder 545 examines each symbol 120 and determines whether the symbol is to be decoded in the present parse or to be stored for decode in a future parse. The symbols that are to be decoded in the present parse, e.g., the first group of symbols 120a are decoded and extracted. The symbols 120 that are to be decoded in a future parse, e.g., symbols 120b, 120c, . . . are placed in one of two shift registers 320.

The shift registers 320 comprise bit positions 325, and preferably have the same width or an even multiple, thereof, as the data words 315 in the memory 305. As the symbols that are to be decoded in a future parse, e.g., symbols 120b, 120c are placed in a particular one of the shift registers 320a, the shift register 320a concatenates the symbols 120b, 120c, . . . . When a symbol 120b, 120c, . . . is placed on the register 320a, the symbol is placed in the next available place in the register 320a. The foregoing results in a concatenation of symbols.

When the register 320a is full, the contents of the register 320a are written to the next available data word 315 in the memory 320, and symbols are written to the other register 320b. It is noted that the symbol 120 boundaries do not necessarily fall on byte boundaries. Therefore, it is possible that a register 320a can only store a portion of a symbol 120 before the register 320a is full. Accordingly, the remainder of the symbol 120 is shifted into the register 320b. The foregoing is repeated with register 320b in a ping-pong fashion.

When the last symbol of the bitstream needs to be stored to the memory, the store to the memory happens irrespective of whether the register 320a was filled completely or not as there are no more symbols to be stored.

As the video decoder 545 parses the bitstream 302, each of the symbols 120, except the symbols in the first group 120a, are stored in the memory 305. The foregoing results in storage of the bitstream 302'. Because the contents of the registers 320a, 320b are stored in the memory 305, the symbols 120b, 120c, . . . forming the bitstream 302' are stored continuously, in contrast to storing each of the symbols 120b, 120c, . . . in a separate data word 315. Storing the bitstream 302' continuously is advantageous to storing the symbols 120b, 120c, . . . in separate data words 315 because each bit in the data words 315 is used to store data from the bitstream 302'.

Figure 4:
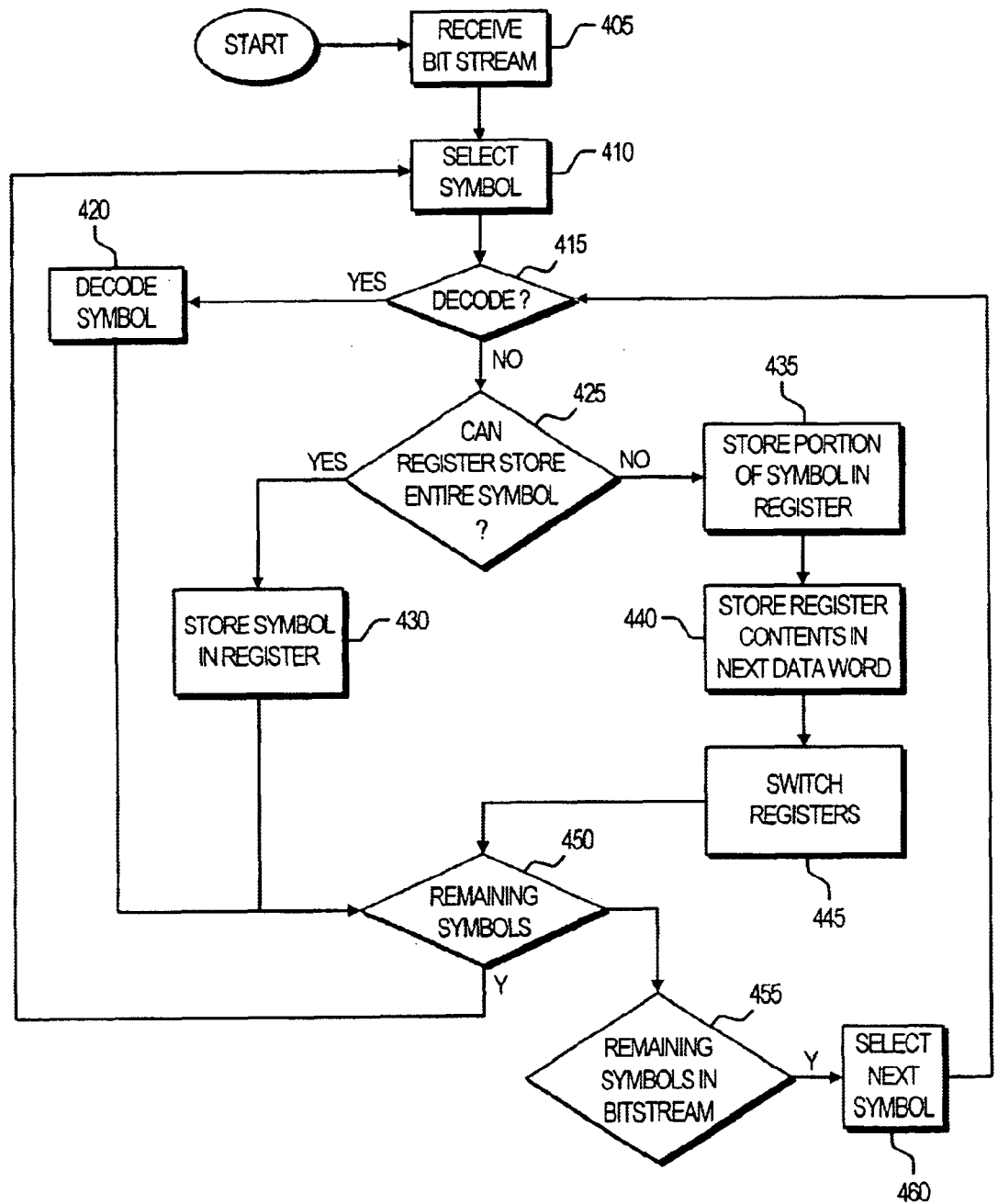
FIG. 4 is a flow chart for decoding a variable length code bitstream in accordance with an embodiment of the present invention.

Referring now to FIG. 4, there is illustrated a flow diagram for decoding a bitstream 302 in accordance with an embodiment of the present invention. At 405, the video decoder 545 receives the bitstream 302. The bitstream 302 can be buffered in a presentation buffer 532, for example.

At 410, the video decoder 545 selects a symbol 120 and at 415, the video decoder 545 determines whether to decode the symbol 120. If at 415 the video decoder 545 determines that the symbol 120, i.e., a symbol 120 from the first group of symbols 120, is to be decoded, the video decoder 545 decodes the symbol 120 at 420. If at 415, the symbol 120 is not to be decoded, at 425 a determination is made whether the register, e.g., register 320a, can store the entire symbol 120. If, for example, the register 320a is close to full, only a portion of the symbol 120 can be stored therein. If during 425, the entire symbol can be stored in the register 320a, the symbols is stored (430) in the register 320a.

If during 425, the entire symbol cannot be stored in the register 320a, the portion of the symbol 120 that can be stored into the register 320a is shifted (435) into the register 320a, the contents of the register 320a are stored (440) into the next available data word 315 in the memory 305, and the registers 320a, 320b are switched (445). The remaining portion of the symbol 120 is shifted into register 320b.

At 450, a determination is made whether there are remaining symbols in the bitstream 312 after the symbol selected during 410. If there are remaining symbols in the bitstream 312 during 450, 410–450 are repeated. If there are no remaining symbols in the bitstream 312 during 450, the parse is complete, and a determination (455) is made whether there are remaining symbols 120 in the bitstream 312'. If there are symbols 120 in the bitstream 312', the symbols at the start of the bitstream 312' is selected (460) and 415–455 are repeated. If during 450, there are no remaining symbols, the decoding of the variable length symbols 120 of the bitstream 312 is completed.

The decoder system as described herein may be implemented as a board level product, as a single chip, application specific integrated circuit (ASIC), or with varying levels of the decoder system integrated with other portions of the system as separate components. The degree of integration of the decoder system will primarily be determined by the speed and cost considerations. Because of the sophisticated nature of modern processor, it is possible to utilize a commercially available processor, which may be implemented external to an ASIC implementation. Alternatively, if the processor is available as an ASIC core or logic block, then the commercially available processor can be implemented as part of an ASIC device wherein the flow diagram of FIG. 4 is implemented in firmware.

While the invention has been described with reference to certain embodiments, it will be understood by those skilled in the art that various changes may be made and equivalents may be substituted without departing from the scope of the invention. In addition, many modifications may be made to adapt particular situation or material to the teachings of the invention without departing from its scope. Therefore, it is intended that the invention not be limited to the particular embodiment(s) disclosed, but that the invention will include all embodiments falling within the scope of the appended claims.

What is claimed is:

1. A method for decoding variable length codes, said method comprising:

receiving a stream comprising a first plurality of variable length codes and a second plurality of variable length codes;

decoding the first plurality of variable length codes;

storing one or more symbols from the second plurality of variable length codes in a first register;

storing a portion of a particular symbol from the second plurality of variable length codes in the first register;

storing another portion of the particular symbol in a second register; and storing the contents of the first register in memory after storing the portion of the particular symbol from the second plurality of variable length codes in the first register.

2. The method of claim 1, further comprising:

storing one or more symbols from the second plurality of variable length codes in the second register;

storing a portion of another particular symbol from the second plurality of variable length codes in the second register;

storing another portion of the another particular symbol in the first register; and storing the contents of the second register in memory after storing the portion of the another particular symbol from the second plurality of variable length codes in the second register.

3. The method of claim 2, the contents of the first register and the contents of the second register being stored in adjacent locations in the memory.

4. The method of claim 1, the register and the memory being characterized by a width, the width of the register and the width of the memory being equal.

5. A system for decoding variable length codes, said system comprising:

a presentation buffer for receiving a stream comprising a first plurality of variable length codes and a second plurality of variable length codes;

a processor for decoding the first plurality of variable length codes;

a first register for storing one or more symbols from the second plurality of variable length codes and a portion of a particular symbol from the second plurality of variable length codes;

a second register for storing another portion of the particular symbol; and memory for storing the contents of the first register after storing the portion of the particular symbol from the second plurality of variable length codes in the first register.

6. The system of claim 5, the second register storing one or more symbols from the second plurality of variable length codes, and a portion of another particular symbol from the second plurality of variable length codes;

the first register storing another portion of the another particular symbol; and the memory storing the contents of the second register after storing the portion of the another particular symbol from the second plurality of variable length codes in the second register.

7. The system of claim 6, the contents of the first register and the contents of the second register being stored in adjacent locations in the memory.

8. The system of claim 5, the register and the memory being characterized by a width, the width of the register and the width of the memory being equal.

9. A circuit for decoding variable length codes, said circuit comprising:

a processor connected to the data memory; and memory storing a plurality of instructions executable by the processor, the plurality of instructions comprising:

decoding the first plurality of variable length codes;

writing one or more symbols from the second plurality of variable length codes in a first register;

writing a portion of a particular symbol from the second plurality of variable length codes in the first register;

writing another portion of the particular symbol in a second register; and writing the contents of the first register in memory after writing the portion of the particular symbol from the second plurality of variable length codes in the first register.

10. The system of claim 9, wherein the plurality of instructions further comprise:
   storing one or more symbols from the second plurality of variable length codes in the second register;
   storing a portion of another particular symbol from the second plurality of variable length codes in the second register;
   storing another portion of the another particular symbol in the first register; and
   storing the contents of the second register in memory after storing the portion of the another particular symbol from the second plurality of variable length codes in the second register.

11. The system of claim 10, the contents of the first register and the contents of the second register being stored in adjacent locations in the memory.

12. The system of claim 9, the register and the memory being characterized by a width, the width of the register and the width of the memory being equal.

* * * * *